(12) United States Patent
Fukugawa et al.

(10) Patent No.: US 11,081,344 B2
(45) Date of Patent: Aug. 3, 2021

(54) METHOD FOR MANUFACTURING SEMICONDUCTOR SUBSTRATE

(71) Applicant: FUJIFILM BUSINESS INNOVATION CORP., Tokyo (JP)

(72) Inventors: Atsushi Fukugawa, Ebina (JP); Michiaki Murata, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

(21) Appl. No.: 16/805,896

(22) Filed: Mar. 2, 2020

(65) Prior Publication Data

US 2020/0203160 A1 Jun. 25, 2020

Related U.S. Application Data

(63) Continuation of application No. PCT/JP2019/000093, filed on Jan. 7, 2019.

(30) Foreign Application Priority Data

Jan. 25, 2018 (JP) .............................. JP2018-010753

(51) Int. Cl.
*H01L 21/00* (2006.01)
*H01L 21/02* (2006.01)
*H01L 21/463* (2006.01)
*H01L 21/304* (2006.01)

(52) U.S. Cl.
CPC .. *H01L 21/02293* (2013.01); *H01L 21/02175* (2013.01); *H01L 21/304* (2013.01); *H01L 21/463* (2013.01)

(58) Field of Classification Search
None
See application file for complete search history.

(56) References Cited

U.S. PATENT DOCUMENTS

| | | |
|---|---|---|
| 2005/0093101 A1 | 5/2005 | Matsumoto |
| 2007/0167021 A1 | 7/2007 | Matsumoto |
| 2007/0284696 A1 | 12/2007 | Matsumoto |
| 2009/0029550 A1 | 1/2009 | Matsumoto |
| 2010/0267175 A1 | 10/2010 | Amada et al. |
| 2012/0009695 A1 | 1/2012 | Amada et al. |
| 2012/0021591 A1 | 1/2012 | Matsumoto |

(Continued)

FOREIGN PATENT DOCUMENTS

| | | |
|---|---|---|
| JP | 2005-136167 A | 5/2005 |
| JP | 2010-040935 A | 2/2010 |

(Continued)

OTHER PUBLICATIONS

Feb. 5, 2019 International Search Report issued in International Patent Application No. PCT/JP2019/000093.

(Continued)

*Primary Examiner* — Reema Patel
(74) *Attorney, Agent, or Firm* — Oliff PLC

(57) ABSTRACT

Provided is a method for manufacturing a semiconductor substrate including: preparing a semiconductor substrate having a front surface on which an epitaxial layer has been formed; and forming a fracture layer on a rear surface of the semiconductor substrate before forming elements on the epitaxial layer.

18 Claims, 3 Drawing Sheets

(56) References Cited

U.S. PATENT DOCUMENTS

| | | | | |
|---|---|---|---|---|
| 2012/0149177 A1* | 6/2012 | Nakayoshi | ............... | C30B 29/06 |
| | | | | 438/478 |
| 2012/0282443 A1* | 11/2012 | Fujito | ............... | H01L 21/02389 |
| | | | | 428/174 |
| 2013/0248932 A1* | 9/2013 | Tomabechi | ......... | H01L 21/0254 |
| | | | | 257/194 |

FOREIGN PATENT DOCUMENTS

| JP | 2011-044491 A | 3/2011 |
|---|---|---|
| JP | 5431777 B2 | 3/2014 |

OTHER PUBLICATIONS

Feb. 5, 2019 Written Opinion issued in International Patent Application No. PCT/JP2019/000093.

\* cited by examiner

METHOD FOR MANUFACTURING SEMICONDUCTOR SUBSTRATE

CROSS-REFERENCE TO RELATED APPLICATIONS

This is a continuation of International Application No. PCT/JP2019/000093 filed on Jan. 7, 2019, and claims priority under 35 USC 119 from Japanese Patent Application No. 2018-010753 filed on Jan. 25, 2018.

BACKGROUND

Technical Field

The present invention relates to a method for manufacturing a semiconductor substrate.

Related Art

In Patent Literature 1, there is disclosed a method for manufacturing a semiconductor device which includes a step of forming a first metal film on a first main surface of a semiconductor wafer having a first thickness, a step of performing a back grinding process on a second main surface side of the semiconductor wafer, thereby making the semiconductor wafer have a second thickness smaller than the first thickness, a step of forming an insulting film pattern on the second main surface of the semiconductor wafer along the periphery thereof such that the insulting film pattern is composed of a first insulting film and includes an annular insulting film pattern along the periphery of the second main surface, a step of making the thickness of an opening part of the annular insulting film pattern a third thickness smaller than the second thickness, a step of performing an electrical test on the semiconductor wafer in the state where there is the insulting film pattern, a step of bonding the second main surface of the semiconductor wafer to an adhesive sheet, thereby holding the semiconductor wafer on a dicing frame with the adhesive sheet interposed therebetween, in the state where there is the insulting film pattern, and a step of dividing the semiconductor wafer into individual chips in the state where the semiconductor wafer is held on the dicing frame.

CITATION LIST

Patent Literature

Patent Literature 1: Japanese Patent No. 5431777

SUMMARY

Aspects of non-limiting exemplary embodiments of the present disclosure relates to provide a method for manufacturing a semiconductor substrate such that warpage is suppressed as compared to the case where any fracture layer is not formed.

Aspects of certain non-limiting exemplary embodiments of the present disclosure address the features discussed above and/or other features not described above. However, aspects of the non-limiting exemplary embodiments are not required to address the above features, and aspects of the non-limiting exemplary embodiments of the present disclosure may not address features described above.

According to an aspect of the present disclosure, there is provided a method for manufacturing a semiconductor substrate including: preparing a semiconductor substrate having a front surface on which an epitaxial layer has been formed; and forming a fracture layer on a rear surface of the semiconductor substrate before forming elements on the epitaxial layer.

BRIEF DESCRIPTION OF DRAWINGS

Exemplary embodiment(s) of the present invention will be described in detail based on the following figures, wherein.

DETAILED DESCRIPTION

With reference to FIG. 1A to FIG. 3B, a method for manufacturing a semiconductor substrate according to the present exemplary embodiment will be described in detail.

First, the background of the method for manufacturing a semiconductor substrate according to the present exemplary embodiment will be described. As the diameters of semiconductor substrates have increased and semiconductor substrates have been thinned, warpage of semiconductor substrates in manufacturing steps (such as conveyance and exposure) has become a problem. Also, although various kinds of semiconductor elements may be manufactured on semiconductor substrates, especially, in the case where semiconductor elements are light emitting elements such as VCSELs (Vertical Cavity Surface Emitting Lasers), thick epitaxial layers (for example, about more than 10 μm) becomes a problem in particular. Therefore, in the manufacturing steps, a method of straightening warpage is required.

In the related art, a method of forming a CVD (Chemical Vapor Deposition) film on the surface layer of a semiconductor substrate compressively stressed by an epitaxial layer in order to generate tensile stress, thereby straightening warpage, is known. However, in this method, for the CVD film formed the surface layer, restrictions are imposed on subsequent steps such as element formation.

For this reason, in the present exemplary embodiment, before elements are formed on an epitaxial layer (before various films, electrodes, wiring lines, etc. are formed), a fracture layer is formed on the rear surface of a semiconductor substrate, for example, by grinding. Therefore, a method for manufacturing a semiconductor substrate such that warpage of the substrate is suppressed as compared to the case where any fracture layer is not formed is provided. Herein, the term "fracture layer" means a layer having fine cracks or crystal lattice disturbance due to damage caused by grinding or the like. By the way, it is general to finally thin a semiconductor substrate having semiconductor elements formed thereon, and grinding is not performed before semiconductor elements are formed. The reason is that grinding may generate fine fragments (dust) of a semiconductor substrate to contaminate the surface having an epitaxial layer formed thereon, or may reduce the strength of the substrate.

With reference to FIG. 1, steps of the method for manufacturing a semiconductor substrate according to the present exemplary embodiment will be described. In the present exemplary embodiment, the case where semiconductor elements which are manufactured using a semiconductor substrate are VCSELs will be described as an example.

Figure 1A:
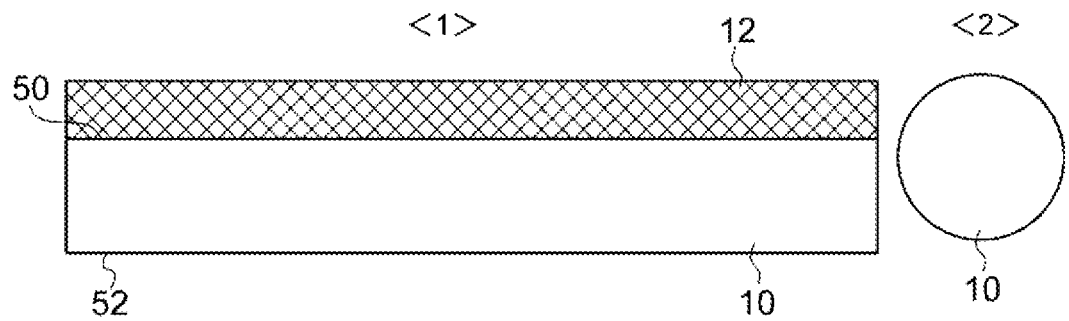
FIG. 1A shows <1> a cross-sectional view and <2> a bottom view of a semiconductor substrate having a front surface on which an epitaxial layer has been formed.

First, a semiconductor substrate 10 whose front surface 50 has an epitaxial layer 12 formed thereon is prepared (FIG. 1A). In other words, in the present exemplary embodiment, the surface of the semiconductor substrate 10 where the epitaxial layer is formed is referred to as the "front surface", and the surface facing the front surface is referred to as the rear surface. In individual views of FIG. 1A, a view marked with <1> shows a cross-sectional view of the semiconductor substrate 10, and a view marked with <2> shows a bottom view of the semiconductor substrate 10. The epitaxial layer is a layer formed by epitaxial growth, and epitaxial growth is one of thin film crystal growth technologies, and is a growth method of performing crystal growth on a crystal to be a substrate such that crystals are arranged together on the crystal surface of the base substrate. The epitaxial layer 12 according to the present exemplary embodiment includes a lower reflector, an active layer, an upper reflector, and so on which constitute VCSELs. In some cases, a rear surface 52 of the semiconductor substrate 10 is mirror-finished to prevent falling off of fine fragments and so on from occurring.

In this case, in the semiconductor substrate 10, warpage may be caused by the epitaxial layer 12. Details of warpage will be described below. By the way, the semiconductor substrate according to the present exemplary embodiment is not particularly limited to GaAs (gallium arsenide) substrates, InP (indium phosphide) substrates, Si (silicon) substrates, etc., and in the present exemplary embodiment, a GaAs substrate will be described as an example.

Figure 1B:
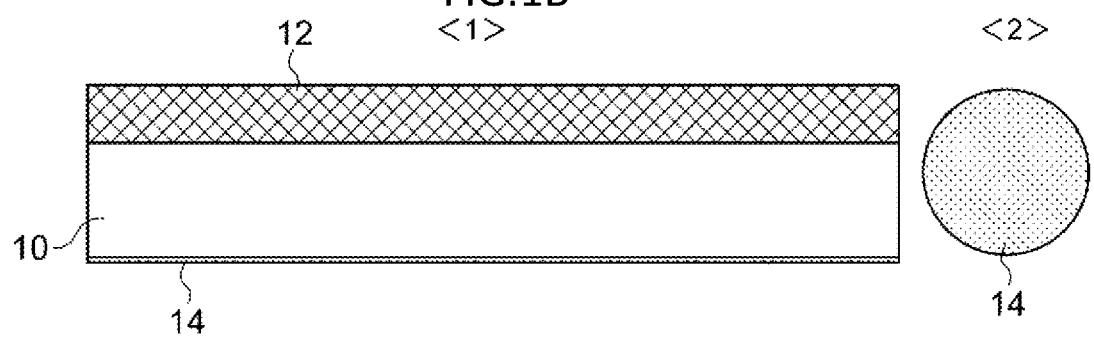
FIG. 1B shows <1> a cross-sectional view and <2> a bottom view of a semiconductor substrate having a rear surface on which a fracture layer is formed.

Next, on the rear surface of the semiconductor substrate 10, a fracture layer 14 is formed (FIG. 1B). In the present exemplary embodiment, warpage attributable to the epitaxial layer 12 is straightened (the amount of warpage is alleviated) by the fracture layer 14. Although formation of the fracture layer 14 may be performed, for example, by grinding (so-called back grinding) or polishing, in the present exemplary embodiment, it is performed by grinding in order to increase the degree of fracture. Grinding is performed, for example, with a grinding wheel, and in the present exemplary embodiment, grinding is performed with a grinding wheel having an abrasive-grain diameter selected such that straightening of warpage attributable to the epitaxial layer 12 is properly carried out. Details of selection of an abrasive-grain diameter will be described below.

Figure 1C:
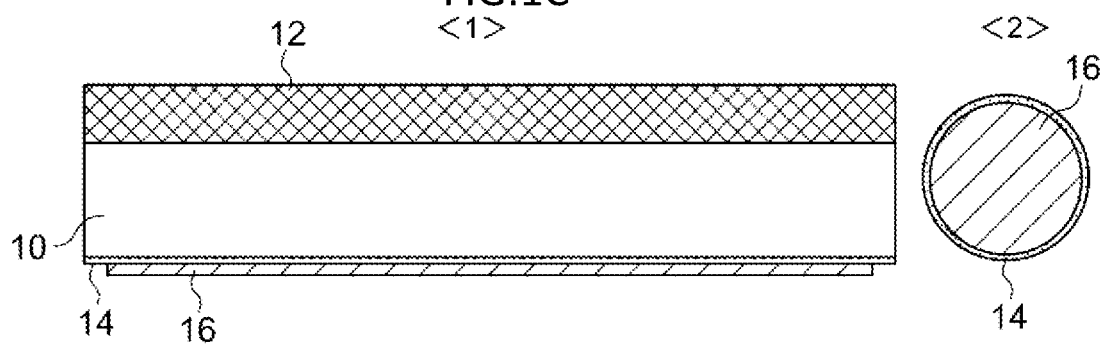
FIG. 1C shows <1> a cross-sectional view and <2> a bottom view of a semiconductor substrate having a protective film on the fracture layer.

Next, on the fracture layer 14, a protective film 16 is formed (FIG. 1C). Although the protective film 16 may be formed of a metal film, a resist film, etc., in the present exemplary embodiment, it is formed of Au (gold). In the case of forming the protective film 16 of gold, a Ti (titanium) film may be interposed between the protective film and a base layer (an adhesion layer). In the case of forming the protective film 16 of a metal, the protective film endures even though it is subjected to a thermal process or an oxidation process in a subsequent step. Therefore, the fracture layer 14 is protected. Further, in particular, in the case of forming the protective film of Au, since Au is non-oxidizing, and is stable against chemicals and gases which are used in the step, it is suitable particularly for the case where subsequent steps include processes using them. Meanwhile, in the case of forming the protective film 16 of a resist film, the protective film may be formed more easily.

A purpose of forming the protective film 16 is to prevent fine fragments of the semiconductor substrate 10 from falling off from the rear surface of the semiconductor substrate 10 having the fracture layer 14 formed thereon and contaminating the semiconductor substrate 10 and so on as a foreign matter (particles). Also, it may be considered that if the manufacturing steps include a step for etching the semiconductor substrate 10, the fracture layer 14 is cut and removed, whereby the warpage straightening effect changes, and the amount of warpage of the semiconductor substrate 10 changes, and it becomes difficult to manage the amount of warpage (variation increases). For this reason, the protective film 16 is for preventing the fracture layer 14 from being removed.

Figure 1D:
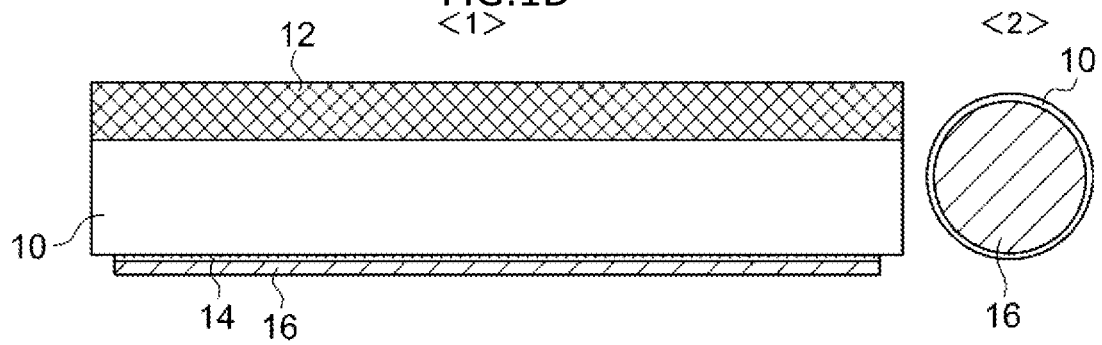
FIG. 1D shows <1> a cross-sectional view and <2> a bottom view of a semiconductor substrate in which peripheral part of the fracture layer is removed.

Next, the fracture layer 14 which is positioned at the peripheral part of the semiconductor substrate 10 and on which the protective film 16 has not been formed (hereinafter, referred to as the uncovered fracture layer) is removed (FIG. 1D). The reason why the uncovered fracture layer remains is that in FIG. 1C, when the protective film 16 is formed, especially, when the protective film 16 is formed of a metal film, support jigs for fixing the semiconductor substrate 10 are brought into contact with a part corresponding to the uncovered fracture layer. The fracture layer 14 and the protective film 16 are removed in a predetermined subsequent step, for example, by grinding. Removal of the uncovered fracture layer is performed by light etching using, for example, wet etching. Removal of the uncovered fracture layer is performed to prevent fine fragments from falling off from the corresponding part. In other words, in the case where falling off of fine fragments does not become a problem, it is not necessarily needed to remove the uncovered fracture layer.

Thereafter, general steps for manufacturing VCSELs, i.e. a step for forming VCSEL elements, a step for measuring characteristics (intermediate characteristics) of the VCSEL elements which is performed if necessary, a step for removing the fracture layer 14 and the protective film 16, a step for thinning the semiconductor substrate 10 by grinding the rear surface of the semiconductor substrate 10, a step for forming an electrode on the rear surface of the semiconductor substrate 10, a step for testing the VCSEL elements, a step for individualizing the VCSEL elements, etc. are performed. Here, in the case where the protective film 16 has been formed of a metal, in the step for measuring the intermediate characteristics (for example, for quality determination), the protective film 16 is used as a rear electrode (provisional metal). Also, in order to form ohmic contact between the semiconductor substrate 10 using GaAs and the rear electrode, it is preferable to use Au as the protective film 16.

Figure 2A:
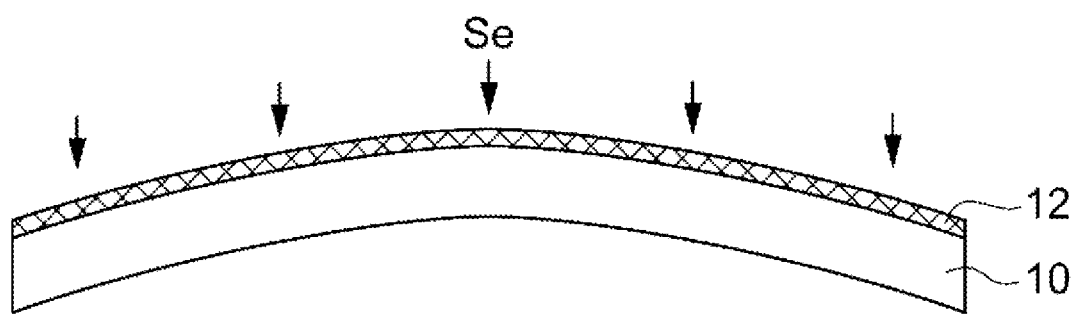
FIG. 2A is a view for explaining warpage of the semiconductor substrate which is caused by stress of an epitaxial layer.
Figure 2B:
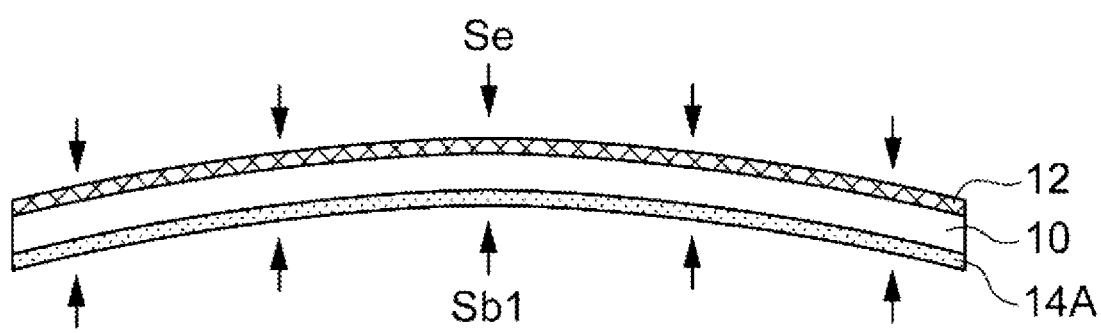
FIG. 2B is a view for explaining warpage of the semiconductor substrate when stress attributable to a fracture layer has been applied.
Figure 2C:
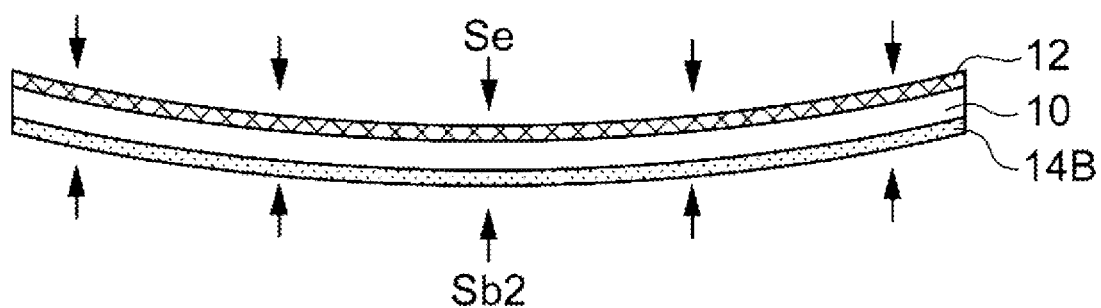
FIG. 2C is a view for explaining reverse warpage of the semiconductor substrate.

Now, warpage of the semiconductor substrate 10 will be described with reference to FIGS. 2A to 2C. FIG. 2A is a view illustrating warpage of the semiconductor substrate 10 which is caused by stress of the epitaxial layer 12; FIG. 2B is a view illustrating warpage of the semiconductor substrate 10 when stress attributable to the fracture layer 14 has been applied; and FIG. 2C is a view illustrating reverse warpage of the semiconductor substrate.

As shown in FIG. 2A, if the epitaxial layer 12 is formed on the semiconductor substrate 10, stress (compressive stress) Se occurs such that the whole of the semiconductor substrate 10 is curved in such a convex shape that the epitaxial layer 12 becomes the convex side. This is warpage attributable to the epitaxial layer 12.

If a fracture layer 14A is subsequently formed on the rear surface of the semiconductor substrate 10 in which warpage has been caused by the epitaxial layer 12, stress (compressive stress) Sb1 occurs. Since the stress Se and the stress Sb1 are formed on the surfaces facing each other and both are stress in the compressing direction, they are cancelled by each other, whereby the warpage attributable to the epitaxial layer 12 is straightened.

Figure 3A:
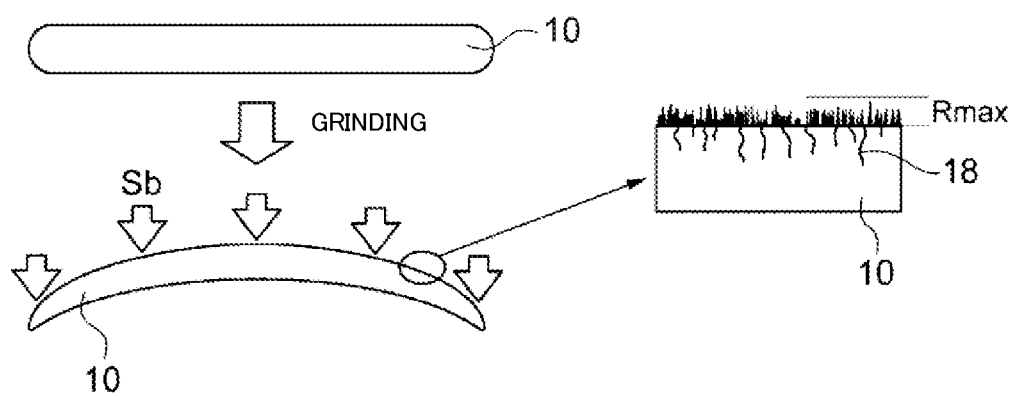
FIG. 3A is a view for explaining warpage of the semiconductor substrate which is caused by grinding.

With reference to FIG. 3A, occurrence of the stress Sb1 will be described in detail. FIG. 3A is a view for conceptually explaining occurrence of the stress Sb1. As shown in FIG. 3A, if the semiconductor substrate 10 is ground (if the fracture layer 14 is formed), stress Sb which is compressive stress occurs over the entire semiconductor substrate 10. By this stress Sb, the entire semiconductor substrate 10 is warped such that the ground surface becomes the convex side. This compressive stress attributable to grinding is caused by occurrence of grinding damage 18 (cracks) on the ground surface side as shown in FIG. 3A. The degree of grinding damage 18 is indirectly measured, for example, on the basis of roughness of the front surface of the semiconductor substrate 10 (such as a maximum height Rmax).

FIG. 2C is a view illustrating "reverse warpage" of the semiconductor substrate 10. In the present exemplary embodiment, the term "reverse warpage" means such warpage that the epitaxial layer 12 becomes the concave side. In the case where the degree of formation of a fracture layer 14B is large and stress Sb2 which is compressive stress is large, such reverse warpage may occur. In the case of setting an amount of warpage attributable to the fracture layer 14 in view of subsequent steps, an amount of warpage may be set such that such reverse warpage occurs.

Therefore, in forming the fracture layer 14 for straightening warpage attributable to the epitaxial layer 12, it is preferable that the degree of stress Sb which is compressive stress should be finely adjustable. For this reason, in the present exemplary embodiment, for grinding for forming the fracture layer 14, changing between grinding-wheel abrasive-grain diameters (grinding-wheel numbers) is performed according to amounts of straightening of warpage.

Figure 3B:
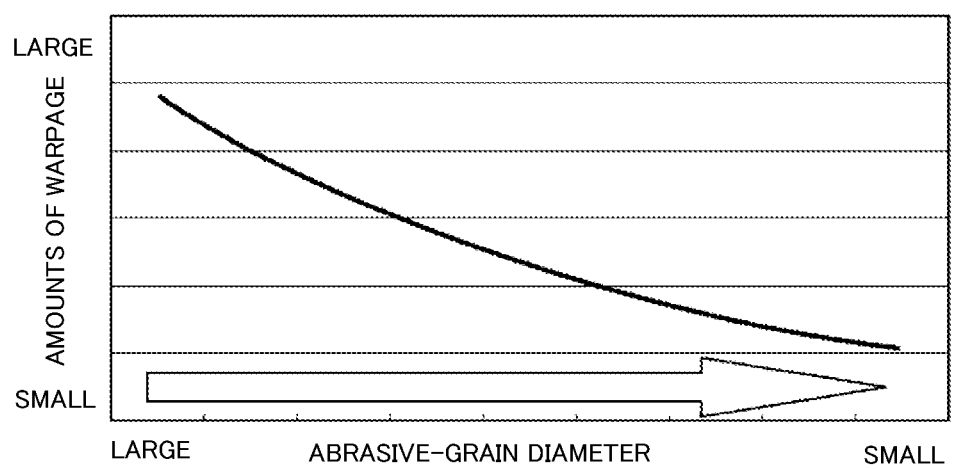
FIG. 3B is a graph illustrating the relation between the abrasive-grain diameters of finish grinding wheels and amounts of warpage.

FIG. 3B shows the relation between the grinding-wheel abrasive-grain diameters and amounts of warpage. The horizontal axis represents the abrasive-grain diameters and the abrasive-grain diameters decrease. In this case, the grinding-wheel numbers increase. Also, on the vertical axis, the magnitudes of amounts of warpage which occur when semiconductor substrates having the same diameter are ground by the same amount (for example, 50 μm) with grinding wheels having the individual abrasive-grain diameters are shown. As shown in FIG. 3B, as the abrasive-grain diameters decrease, the amounts of warpage which occur decrease. Meanwhile, as the abrasive-grain diameters decrease, straightening of a minuter amount of warpage is performed, but the grinding time becomes longer. Like this, the degree of straightening of warpage is adjusted according to abrasive-grain diameter selection, and if necessary, it is possible to reversely warp the semiconductor substrate 10.

Now, other parameters which influence setting of an amount of warpage during formation of the fracture layer 14 (abrasive-grain diameter selection) will be described. As described above, warpage is caused by the epitaxial layer 12. The amount of warpage at that time increases as the thickness of the epitaxial layer 12 increases. Also, as the diameter of the semiconductor substrate 10 on which the epitaxial layer 12 is formed increases, and as the thickness of the semiconductor substrate decreases, the amount of warpage increases.

Meanwhile, after the protective film 16 is formed, the process proceeds, and by forming of the VCSEL elements by etching or the like, and so on, the epitaxial layer 12 is divided. At this time, some parts of the epitaxial layer 12 are removed. If some parts of the epitaxial layer 12 are removed, since the compressive stress which causes warpage decreases (the semiconductor substrate is reversely straightened), the amount of warpage decreases. Meanwhile, the thickness of the semiconductor substrate 10 having the VCSEL elements formed thereon which is, for example, 600 μm to 650 μm at the beginning decreases to, for example, 500 μm in the middle of the process, and finally decreases to, for example, about 150 μm. This thinning acts in such a direction that the amount of warpage increases.

In other words, if occurrence of reverse straightening or warpage in a subsequent step is taken into account, when the fracture layer 14 for straightening warpage is formed, the semiconductor substrate 10 does not necessarily need to be straightened until the semiconductor substrate becomes flat (the amount of warpage less than 10 μm). Here, for example, warpage of the semiconductor substrate 10 may cause an absorption error in the conveying step, resulting in a conveyance failure. Also, in an exposing step using a stepper (an exposure device), the focus may not be set in the plane of the semiconductor substrate 10, resulting in a focusing failure. However, with respect to these failures which may be considered in the subsequent steps, there is an acceptable warpage amount. Therefore, the semiconductor substrate 10 does not necessarily need to be flat. In other words, the warpage may be intentionally left after formation of the fracture layer 14, and the amount of warpage to be left may be set to an amount of warpage (a target warpage amount) which is acceptable throughout all of the subsequent steps, in view of occurrence of reverse straightening or warpage in the subsequent steps. In other words, after formation of the fracture layer 14, warpage may be left such that in the subsequent steps which are performed after formation of the fracture layer 14, the warpage does not get worse than the amount of warpage after the formation of the fracture layer 14.

Here, since the amount of warpage which is acceptable in each step depends on the kind of a manufacturing apparatus, etc., it difficult to uniformly specify a target warpage amount. However, in general, if the amount of warpage becomes about one hundred and several tens μm, it becomes a problem in the process. Therefore, it is necessary to straighten the warpage, for example, to about several tens μm.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method for manufacturing a semiconductor substrate comprising:
preparing a semiconductor substrate having a front surface on which an epitaxial layer has been formed; and
forming a fracture layer on a rear surface of the semiconductor substrate before forming elements on the epitaxial layer; wherein
the forming of the fracture layer forms the fracture layer by grinding the rear surface of the semiconductor substrate,
the forming of the fracture layer by grinding comprises selecting an abrasive-grain diameter according to the amount of warpage of the semiconductor substrate, and
the abrasive-grain diameter is selected according to the amount of the warpage of the semiconductor before forming the fracture layer.

2. The method for manufacturing a semiconductor substrate according to claim 1,
wherein the forming of the fracture layer straightens warpage of the semiconductor substrate attributable to the epitaxial layer such that the semiconductor substrate becomes flat.

3. The method for manufacturing a semiconductor substrate according to claim 1,
wherein the forming of the fracture layer leaves warpage of the semiconductor substrate attributable to the epitaxial layer such that the warpage does not get worse in a subsequent process after forming the fracture layer.

4. The method for manufacturing a semiconductor substrate according to claim 1,
wherein the forming of the fracture layer leaves warpage of the semiconductor substrate attributable to the epitaxial layer such that the warpage is further straightened in a subsequent process after forming the fracture layer when some parts of the epitaxial layer are removed.

5. The method for manufacturing a semiconductor substrate according to claim 1, further comprising:
forming elements on the epitaxial layer.

6. A method for manufacturing a semiconductor substrate comprising:
preparing a semiconductor substrate having a front surface on which an epitaxial layer has been formed;
forming a fracture layer on a rear surface of the semiconductor substrate before forming elements on the epitaxial layer; and
forming a protective film on a surface of the fracture layer before forming the elements on the epitaxial layer; wherein
the forming of the fracture layer forms the fracture layer by grinding the rear surface of the semiconductor substrate, and
the forming of the fracture layer by grinding comprises selecting an abrasive-grain diameter according to the amount of warpage of the semiconductor substrate.

7. The method for manufacturing a semiconductor substrate according to claim 6, wherein the protective layer is a metal film.

8. The method for manufacturing a semiconductor substrate according to claim 7,
wherein the metal film is a metal film containing gold.

9. The method for manufacturing a semiconductor substrate according to claim 7, further comprising:
removing a peripheral part of the fracture layer from a peripheral part of the semiconductor substrate where the metal film does not cover the fracture layer.

10. The method for manufacturing a semiconductor substrate according to claim 7,
wherein the metal film is a rear electrode of the semiconductor substrate.

11. The method for manufacturing a semiconductor substrate according to claim 6,
wherein the protective film is a resist film.

12. The method for manufacturing a semiconductor substrate according to claim 11, further comprising:
removing a peripheral part of the fracture layer from a peripheral part of the semiconductor substrate where the resist film does not cover the fracture layer.

13. A method for manufacturing a semiconductor substrate, comprising:
preparing a substrate having a front surface on which an epitaxial layer has been formed;
grinding a rear surface of the substrate before forming elements on the epitaxial layer; and
forming a protective film on a surface of the fracture layer before forming the elements on the epitaxial layer; wherein
the forming of the fracture layer forms the fracture layer by grinding the rear surface of the semiconductor substrate, and
the forming of the fracture layer by grinding comprises selecting an abrasive-grain diameter according to the amount of warpage of the semiconductor substrate.

14. The method for manufacturing a semiconductor substrate according to claim 13,
wherein the grinding of the rear surface comprises selecting an abrasive-grain diameter according to the amount of warpage of the semiconductor substrate.

15. The method for manufacturing a semiconductor substrate according to claim 13, further comprising:
forming a protective film on the rear surface of the substrate after the grinding and before forming the elements on the epitaxial layer.

16. The method for manufacturing a semiconductor substrate according to claim 15, wherein the protective layer is a metal film.

17. The method for manufacturing a semiconductor substrate according to claim 16,
wherein the metal film is a metal film containing gold.

18. The method for manufacturing a semiconductor substrate according to claim 16,
wherein the metal film is a rear electrode of the semiconductor substrate.

* * * * *